(12) United States Patent
Womack et al.

(10) Patent No.: US 6,307,184 B1
(45) Date of Patent: Oct. 23, 2001

(54) THERMAL PROCESSING CHAMBER FOR HEATING AND COOLING WAFER-LIKE OBJECTS

(75) Inventors: Jeffrey D. Womack, Pleasanton; Vuong P. Nguyen, San Jose; Devendra Kumar, Los Altos; Jack S. Kasahara, Los Gatos; Sokol Ibrani, Pleasanton, all of CA (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/351,586

(22) Filed: Jul. 12, 1999

(51) Int. Cl.[7] ....................................................... F27B 5/14
(52) U.S. Cl. .......................... 219/390; 219/405; 118/724; 118/725; 392/416
(58) Field of Search ................................... 219/390, 405, 219/411; 392/416, 418; 118/724, 725, 50.1

(56) References Cited

U.S. PATENT DOCUMENTS

| | | | |
|---|---|---|---|
| 5,462,603 | * 10/1995 | Murakami | 118/719 |
| 5,620,560 | 4/1997 | Akimoto . | |
| 5,772,770 | * 6/1998 | Suda et al. | 118/719 |
| 5,884,009 | 3/1999 | Okase . | |
| 6,002,109 | * 12/1999 | Johnsguard et al. | 219/390 |
| 6,015,594 | * 1/2000 | Yoshikawa | 427/398.1 |

FOREIGN PATENT DOCUMENTS

| | | |
|---|---|---|
| 0 843 347 | 5/1998 | (EP) . |
| 5-5326453 | 12/1993 | (JP) . |
| 8-8310896 | 11/1996 | (JP) . |
| 10-233370 | 9/1998 | (JP) . |

* cited by examiner

Primary Examiner—Teresa Walberg
Assistant Examiner—Shawntina Fuqua
(74) Attorney, Agent, or Firm—Kagan Binder, PLLC

(57) ABSTRACT

A processing chamber and methods for employing this processing chamber to thermally treat wafer-like objects. The chamber comprises a double walled shell, a pedestal style heater, internal passages for the transport of cooling gases and removal of exhaust gases, independently variable gas introduction patterns, and a movable door for sealing the chamber. The chamber is designed to permit in situ cooling of wafer-like objects and to provide means for precise optimization of this cooling. The methods provide for the processing of the wafer-like object in an environment where the temperature, rate of change of the temperature, composition of gases and the relative timings of changes to these variables may be controlled to achieve the desired material properties in the wafer-like object or in films contained on this wafer-like object.

29 Claims, 8 Drawing Sheets

THERMAL PROCESSING CHAMBER FOR HEATING AND COOLING WAFER-LIKE OBJECTS

FIELD OF THE INVENTION

The present invention relates to systems and methods for thermally processing a wafer-like object through a temperature profile that preferably includes both heating and cooling the wafer-like object. In particular, the present invention is directed to an apparatus having a thermal processing chamber which can support, heat and cool such an object with thermal uniformity and effective heat transfer even when the heating requirements are high. The present invention also allows the creation and maintenance of a processing environment constituted of precisely controlled mixtures of gases that may vary widely from the ambient environment.

BACKGROUND OF THE INVENTION

The present invention has been developed for its particular applicability in the processing of semiconductor wafers, such as for making microelectronic devices, where such processing requires precise temperature control and temperature changes. This processing may also require control of the gas mixtures allowed to contact the wafer during the process. Many other types of products and processes involve thermal processing with accurate temperature control of an object, such objects hereinafter referred to as "wafer-like" objects.

In the manufacture of microelectronic devices, such as integrated circuits, flat panel displays, thin film heads, and the like, processing often involves the application of a layer of some material, such as a dielectric, onto the surface of a substrate, such as a semiconductor wafer in the case of integrated circuits. Dielectrics, for example, may need to be baked and then cooled to cure. To prevent oxidation of such a dielectric material, for example, after any processing there of by a baking step, the wafer must be cooled to a certain temperature in an environment of reduced oxygen (an anaerobic environment). Cooling of the wafer also reduces the risk of thermal damage to the wafer transfer mechanism during wafer transfer after processing. The baking and cooling steps must be precisely controlled within exacting temperature constraints to ensure that the selected portions of the dielectric properly set with its desired material properties. Baking and cooling operations for microelectronic devices typically involves cycling a wafer-like object through a desired temperature profile in which the object is maintained at an elevated equilibrium temperature in a controlled environment, cooled to a relatively cool equilibrium temperature, and/or subjected to temperature changes of varying rates (in terms of ° C./s) between the equilibrium temperatures. To accomplish baking and cooling, previously known bake/chill operations have included separate bake and chill plates that have required the use of a wafer transport mechanism in order to physically lift and transfer the wafer itself from one place to the other. This approach presents a number of drawbacks. First, wafer temperature is not controlled during transfer between the bake and chill plates. Second, the overall time required to complete the bake/chill process cannot be precisely controlled because of the variable time required to move the wafer to and from the respective plates. Third, the required movement takes time and thus reduces the throughput of the manufacturing process. Fourth, the cost of equipment is higher than necessary because the apparatus requires extra components to handle the wafer during transport from plate to plate. Fifth, the mechanical move from plate to plate introduces the possibility of contaminating the wafer. Sixth, the wafer is exposed to atmospheric oxygen while it is at elevated temperatures, increasing the risk of oxidation. Seventh, the wafer transfer mechanism is exposed to elevated temperatures, reducing its reliability and/or increasing the complexity and expense of its design.

To overcome these deficiencies, a combination bake/chill apparatus has been previously developed by the assignee of the present invention, which is described in copending U.S. patent application Ser. No. 09/035,628, filed Mar. 5, 1998 and entitled "Combination Bake/Chill Apparatus Incorporating Low Thermal Mass, Thermally Conductive Bakeplate", the entire disclosure of which is incorporated herein by reference. That combination bake/chill apparatus includes a low thermal mass, thermally conductive bakeplate to support a wafer during both its baking and chilling operations. With the wafer on one surface of the bakeplate, the other surface of the bakeplate is selectively brought into or out of thermal contact with a thermally massive chill plate so as to switch between baking and chilling operations. In one version, the bakeplate can rest on top of the chill plate during chilling, and one or both of the components is moved to separate them during baking. The bakeplate can heat a wafer by direct conduction of heat generated by the bakeplate to the wafer, while chilling requires heat transfer from the wafer through the bakeplate (which is not heated during the chilling operation) to the chill plate by conduction, which itself is preferably artificially cooled. Both the bake and chill plates are operatively supported within a housing defining a thermal processing chamber. In particular, the housing is formed as a cylinder comprising a cylindrical side wall, a flat top wall, and a flat bottom wall through which various control components extend. The side wall is split so that the top and bottom walls are relatively movable from one another to provide access within the process chamber for loading and unloading wafers.

In developing the present invention, it was discovered that thermal uniformity of a wafer-like object within such a processing chamber is significantly affected by the design and make-up of the process chamber itself. That is, the components making up the processing chamber as well as the components within the chamber, such as for supporting, heating and cooling a wafer-like object, significantly affect the temperature of the wafer-like object throughout its surface area. This is particularly true where such a wafer-like object is to be uniformly heated at relatively high temperatures, e.g., above 200° C. and as high as 450° C. or more. Newer polymers and coatings for semiconductor wafers cure at temperatures of between 350° C. and 450° C., for example. However, as noted above, precise temperature achievement of the entire surface area of a wafer-like object may be required for effective curing or processing. Such thermal uniformity being required in spite of the fact that such a processing chamber should advantageously be designed as a combination baking and cooling apparatus. That is, thermal uniformity is desired even where a wafer-like object is to be heated and cooled within the same chamber. Thus, the structure defining the process chamber and its internal devices not only affect the uniformity of the thermal processing that is conducted on a wafer-like object, they also are subject to cyclical heating and cooling. In general, thermal uniformity in processing a wafer-like object is a function of the relative thermal uniformity of the chamber and its components. So, to achieve good thermal uniformity, such as during a baking step, the process chamber housing and components should be together brought within a desired temperature range. But, as a result of a subsequent cooling operation, the entire chamber and components would be cooled, or at least its temperature uniformity would be compromised. In any case, cycle times would be lengthened in that the achievement of thermal uniformity of a next heating process would require greater time to assure a subsequent achievement of sufficient temperature uniformity of the process chamber.

In developing the present invention, it was also discovered that the gases contained within the processing environment of a baking and cooling apparatus during both steps should be controlled for enhancing the development of the desired material properties.

SUMMARY OF THE INVENTION

The present invention overcomes the deficiencies and shortcomings of the prior art by providing an apparatus and method for efficiently and effectively heating and cooling a wafer-like object within a controlled environment in the same process chamber. In accordance with the present invention, the process chamber and its components are designed to enhance thermal uniformity for the thermal processing operation, but to permit a temperature profile to be conducted including heating and cooling steps with maximized throughput through the apparatus. In particular, the process chamber can uniformly heat objects to high temperatures and still provide effective cooling in situ, all of which may advantageously occur in an environment where the mixture of gases can be carefully controlled.

In accordance with the present invention, good thermal uniformity can be achieved across the surface area of a wafer-like object while the wafer-like object can achieve sufficiently high and low temperatures in accordance with a desired temperature profile. In particular, the process chamber is designed so that its inner surface remains of a sufficiently high temperature relative to the desired temperature of the heating operation even during the cooling of the wafer-like object. Thus, during a subsequent heating step, good thermal uniformity can be achieved with respect to the surface area of a subsequent wafer-like object and with greater throughput. Preferably, the process chamber is also sufficiently sealable and closeable by a chamber door so that the thermal processing can be conducted within an anaerobic environment created by the suitable flow of inert gases as well.

The above advantages are achieved by carefully controlling the flow of heat (radiatively, connectively and conductively) as well as the composition of the gases in the processing environment. Radiative heat transfer control is achieved by maintaining the surfaces "visible" to the wafer-like object as close to the processing temperature as possible. Convective heat transfer control is achieved by establishing the proper gas flow pattern on the exposed surface of the wafer-like object. This flow pattern may be called upon to correct for other nonuniformities in the process. Conductive heat transfer control is achieved by ensuring uniform contact between the wafer-like object and the heating surface and by ensuring that the contacting surface temperature is as uniform as possible. Control of the gas composition in the processing environment is achieved by isolating the processing environment from the ambient environment and by maximizing the flexibility and control of gas flow in the processing environment.

In the present invention, the surfaces visible to the wafer-like object are preferably maintained close to the processing temperature through the use of three essential features. First, the chamber incorporates a double walled design that allows superior thermal isolation of the inner surface from the much cooler outer surface. Second, the cooling required to maintain some chamber seals within their thermal operating ranges is accomplished by the use of an internal gas cooling channels rather than a liquid cooling channel. Due to their generally lower heat capacity than liquids, gases allow more precise and reliable temperature control by permitting finer control of the heat transfer rate. The thermal limit of liquids also constrains their boiling point, which can create safety as well as reliability hazards. The thermal limit of gases allows the chamber wall to operate at higher temperatures, reducing heat transfer from the wafer-like object and, therefore, improving temperature uniformity. Third, careful control of the heat transfer from the heating element to the chamber bottom and side walls prevent temperature gradients along the walls, improving the uniformity of the visible surfaces. This control may be achieved by reducing the cross sectional area of conductive paths or by increasing their lengths. Control may also be achieved by minimizing emissivity of the heater surface thereby minimizing the radiation between the heater and the chamber wall.

The present invention promotes the development of the proper convective gas flow through the use of three elements. First, the use of separately variable inner and outer gas introduction patterns above the wafer-like object allow the ratio and magnitude of the flows to be adjusted to achieve the optimum flow pattern on the wafer-like object. Second, the use of a door minimizes gas disturbances during transfer of the wafer-like object, minimizing the time required to establish the required gas flow. Third, the use of removable exhaust plate simplifies the investigation of widely varying exhaust patterns, promoting the achievement of the optimum gas flow environment.

To ensure superior conductive heat transfer control, the present invention preferably employs a "pedestal" style heater that contacts the cooler chamber bottom wall at a single, preferably central point. This point of contact may then be carefully minimized to reduce losses to the chamber, improving pedestal surface uniformity. Heater surface uniformity is also improved by maximizing the radiative emissivity between the wafer-like object and the contacting heater surface while minimizing the radiative emissivity between the other heater surfaces and the chamber wall. The radiative emissivity of the heater surfaces may be controlled by chemical (e.g. anodization) or mechanical (e.g. ball peening) treatment. In particular, the surface or surfaces visible to the wafer-like object may be anodized while the other surfaces are left with a finely machined finish. To ensure good contact between the wafer-like object and the heater surface, channels on the pedestal surface are evacuated, the resulting pressure difference across the wafer-like object driving it against the heater surface.

To control the gas composition in the process environment, the present invention employs a door that, as was previously described, minimizes gas disturbances during transfer of the wafer-like object. The separate inner and outer gas introduction patterns allow sophisticated purging routines to be developed that can create the proper gas composition in the minimum amount of time. The removable exhaust plate assists in establishing the optimum gas flow pattern.

BRIEF DESCRIPTION OF THE DRAWINGS

The above-mentioned and other advantages of the present invention, and the manner of attaining them, will become more apparent and the invention itself will be better understood by reference to the following description of the preferred embodiments of the invention taken in conjunction with the accompanying drawings, wherein.

DETAILED DESCRIPTION OF THE PREFERRED INVENTION

Figure 1:
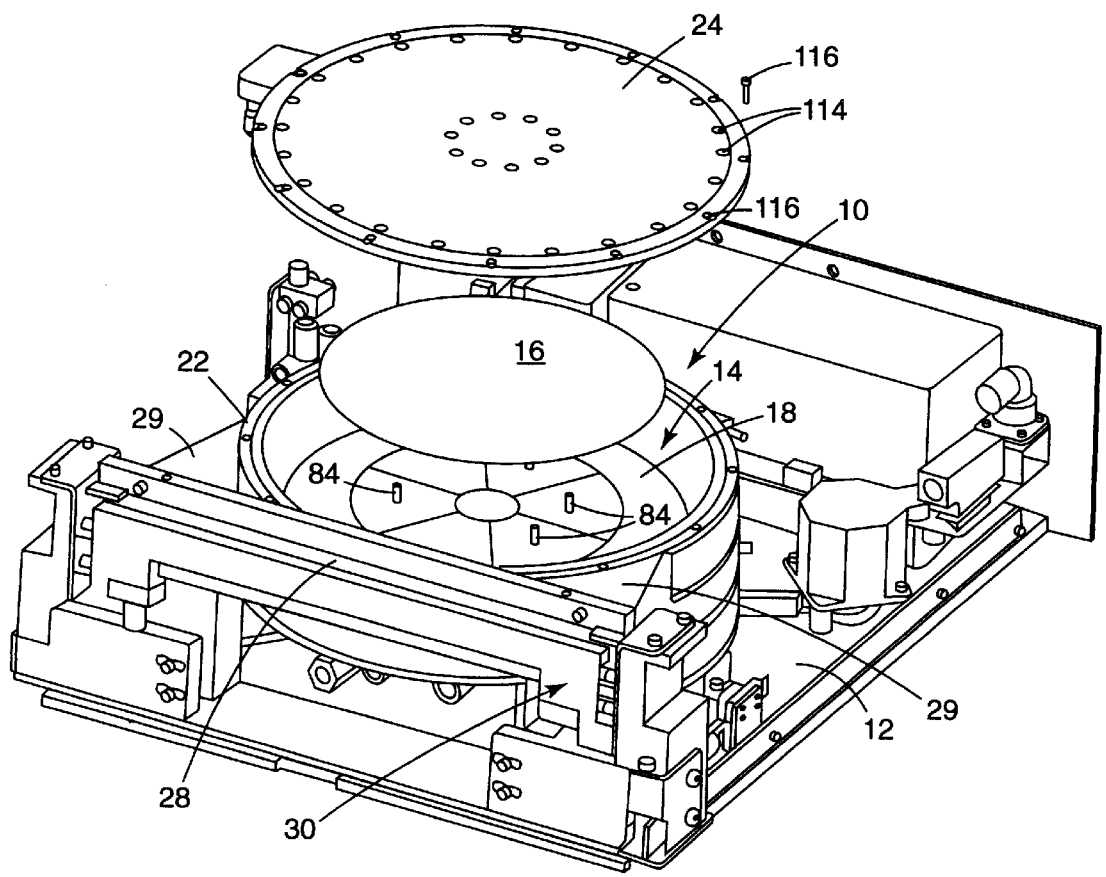
FIG. 1 is a partially exploded view in perspective of an apparatus in accordance with the present invention including a thermal processing chamber for heating and cooling wafer-like objects that are supported within the thermal processing chamber.
Figure 9:
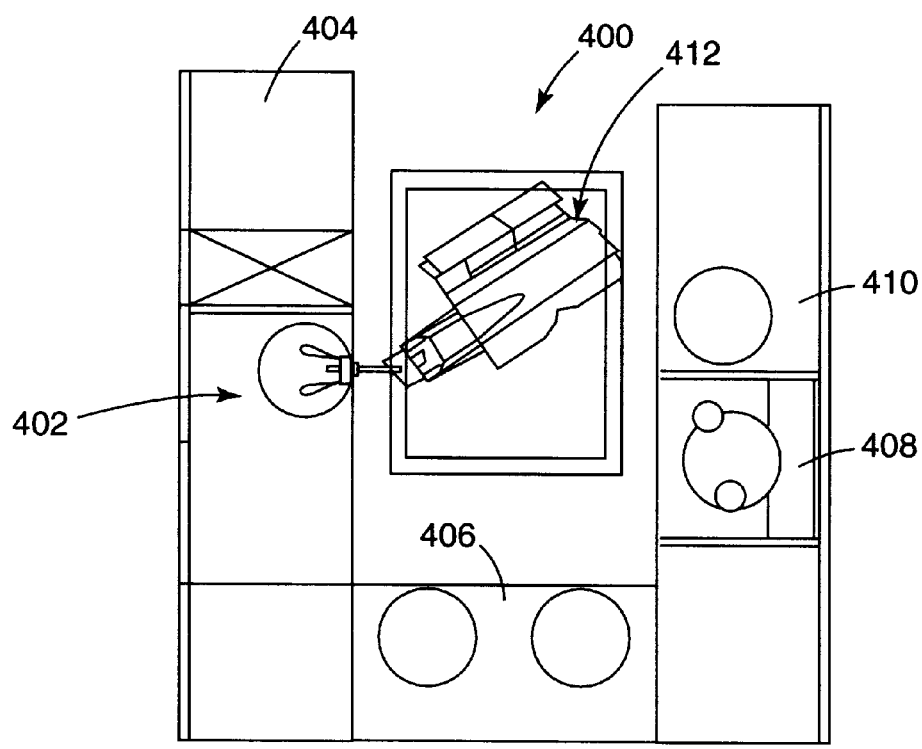
FIG. 9 is a top plan view illustrating a cluster processing apparatus that may include a thermal processing chamber in accordance with the present invention.

With reference to the Figures, wherein like components are labeled with like numerals throughout the several Figures, and initially to FIG. 1, an apparatus is illustrated including a thermal processing chamber 10 supported by a support plate 12 that facilitates mounting of the thermal processing chamber 10 to additional apparatus support structure based upon a particular application. For example, the apparatus may be provided as a stand-alone system wherein the thermal processing chamber 10 and support plate 12 are supported and encased to define a modular piece of equipment. As another example, the thermal processing chamber 10 can be supported by the support plate 12 and positioned within a cluster tool system as illustrated in FIG. 9, which is described in greater detail below.

Figure 2:
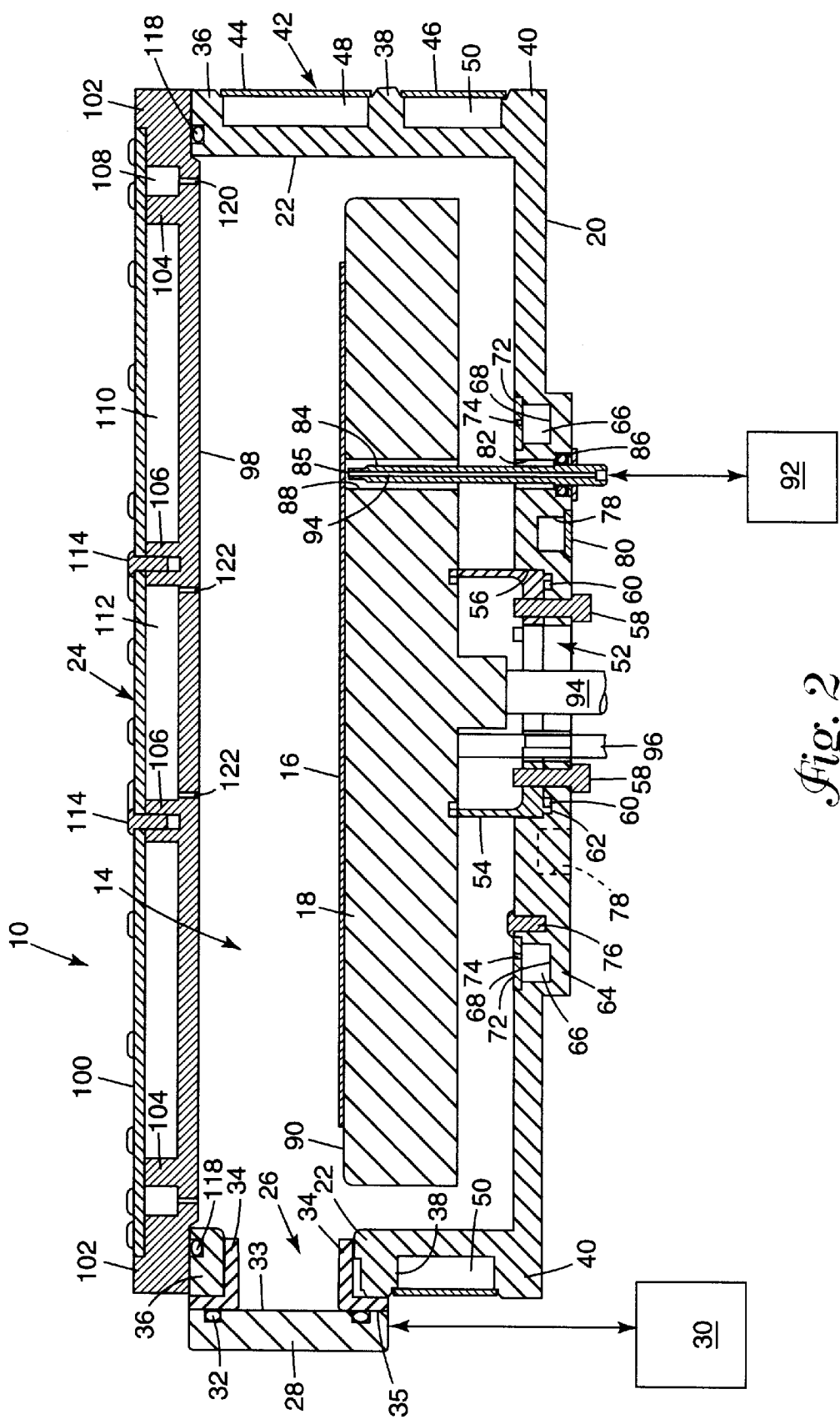
FIG. 2 is a cross sectional view taken through the thermal processing chamber of FIG. 1 and illustrating a wafer-like object supported within the thermal processing chamber that is configured in a heating state with the wafer-like object in thermal transfer contact with a pedestal heater.

With reference also to FIG. 2, an internal chamber 14 is defined within the thermal processing chamber 10 within which a wafer-like object 16 is supported on a pedestal platen 18. Although the present is specifically designed for the processing of semiconductor wafers, it is understood that the present invention may be used for thermal processing of many other types of wafer-like objects 16. The term wafer-like object is meant to include any object that defines at least one major surface that can be supported in thermal transfer contact by a platen and is not limited to substrates that are circular (like a semiconductor wafer). The pedestal platen 18 preferably comprises a pedestal heater, which will be described in greater detail below for the purpose of not only supporting a wafer-like object 16 in thermal transfer contact, but also to generate the heat that is to be transferred to the wafer-like object 16. No heating elements are illustrated in FIGS. 2–4 for the sake of clarity of the other components.

The thermal processing chamber 10 is preferably cylindrical to accommodate circular wafers, but need not be. Preferably, the thermal processing chamber 10 comprises a bottom wall 20, a cylindrical side wall 22 and a lid 24. A transfer slot 26 is provided through a portion of the side wall 22 so as to provide access from outside the internal chamber 14 to within the internal chamber 14. Preferably, the transfer slot 26 is sized and shaped to accommodate a robotic mechanism (not shown) that is usable for loading and unloading a wafer-like object 16 from the platen 18. Moreover, the transfer slot should accommodate the object size (such as 200 mm or 300 mm semiconductor wafers) but may otherwise be minimized to prevent excessive fluid flow therethrough when open. In the case of processing semiconductor wafers it is often desirable to provide an anaerobic environment within the internal chamber 14, so a minimized transfer slot size is beneficial in preventing unwanted flow of certain naturally occurring gases in the environment (such as oxygen) from entering the internal chamber 14.

Figure 3:
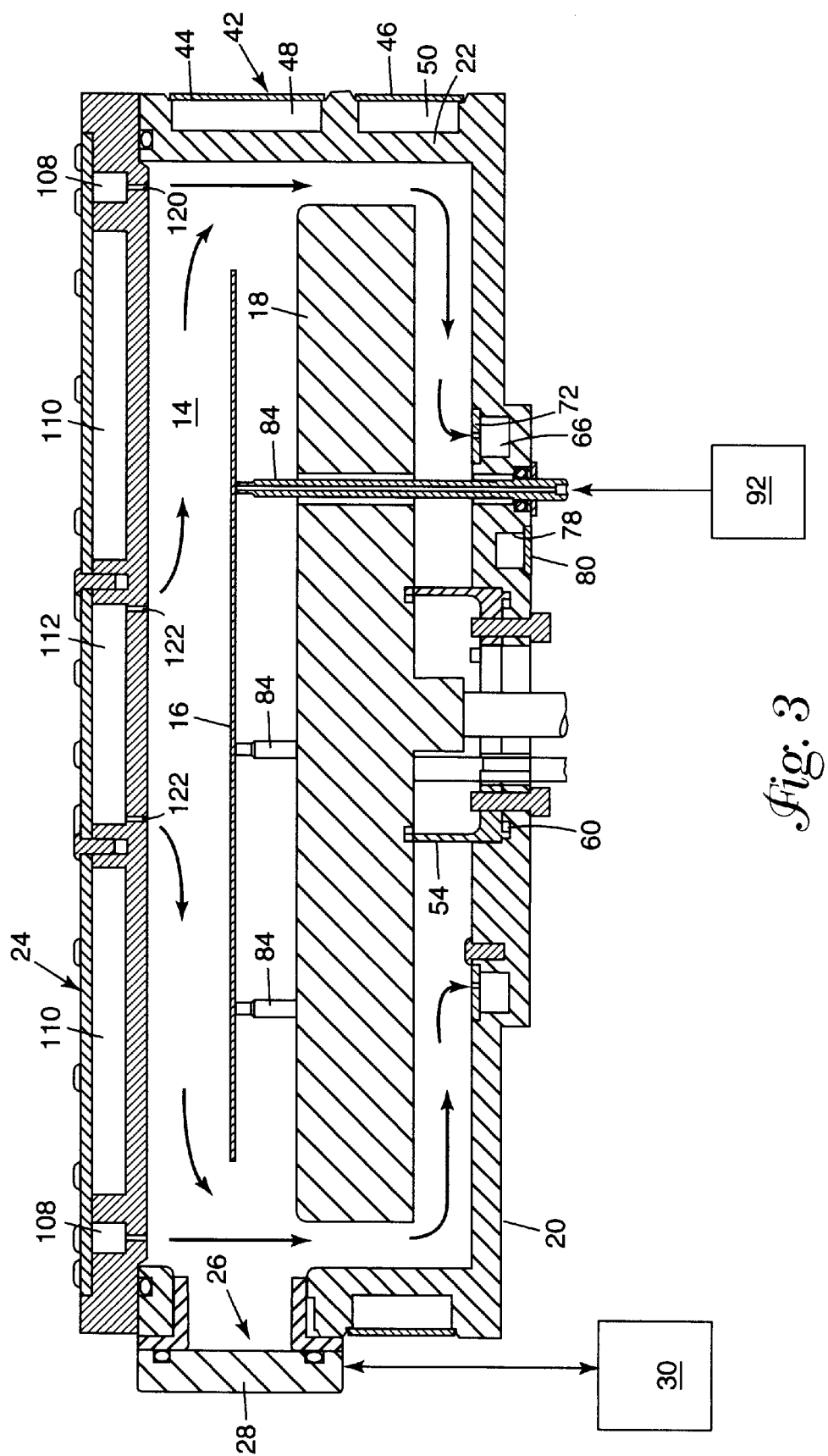
FIG. 3 is another cross sectional view taken through the thermal processing chamber of FIG. 1 and illustrating a wafer-like object supported within the thermal processing chamber that is configured in a cooling state with the wafer-like object supported out of heat transfer contact with the pedestal heater and with the cooling gas flow established.
Figure 4:
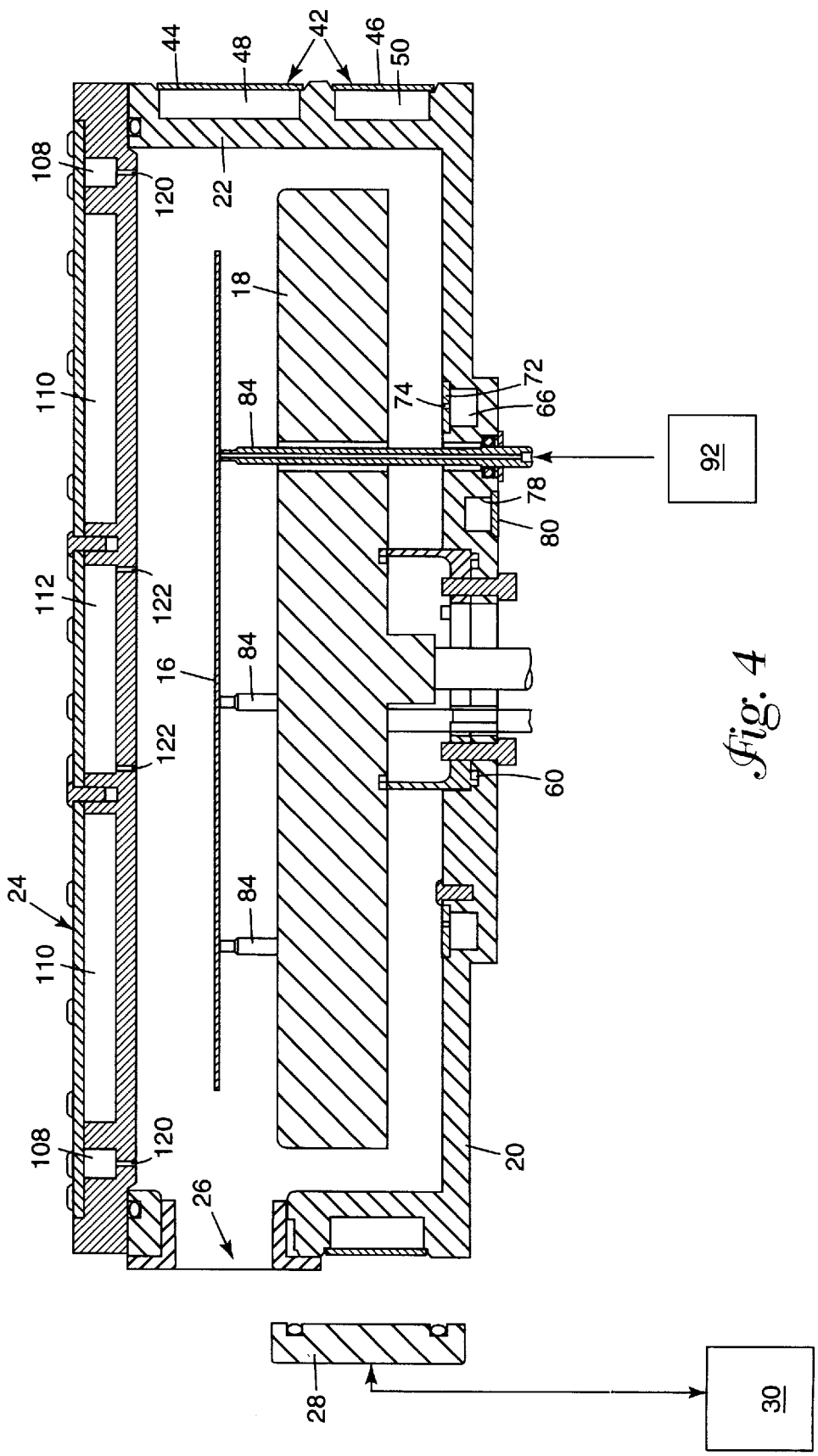
FIG. 4 is another cross sectional view taken through the thermal processing chamber of FIG. 1 and illustrating a wafer-like object supported within the thermal processing chamber that is configured in the transfer state with the chamber door in an open position to permit access to the internal chamber from outside.

The transfer slot 26 is also preferably sealingly closable by a chamber door 28 that is moveable between opened and closed positions by a door closure mechanism 30 that is schematically illustrated in FIGS. 2, 3 and 4. As illustrated in FIG. 1, the chamber door 28 can be a substantially planar panel that closes a transfer slot 26 that actually opens to the outside of the thermal processing chamber 10 by way of a housing adapter 29 that adapts a portion of the cylindrical chamber side wall 22 to provide a rectangular opening capable of being closed by a planar chamber door 28. The housing adapter 29 may be fabricated in any conventional way without compromising the sealable nature of the internal chamber 14. Otherwise, the chamber door 28 could be arc-shaped to fit against the cylindrical outer surface of the side wall 22, the side wall 22 could be otherwise adapted, or the thermal processing chamber can be otherwise shaped. The door closure mechanism 30 can comprise any known or developed mechanism for opening and closing the chamber door 28, but preferably such door closure mechanism 30 not only moves the chamber door 28 between opened and closed positions (i.e., to and from a position in front of the transfer slot 26) but also is capable of urging the chamber 28 toward chamber side wall 22 when the chamber door 28 is positioned in a closed position in front of the transfer slot 26. With the addition of a seal 32 provided within a perimetric groove of the inside surface 33 of the chamber door 28, such a door closure mechanism 30 assures a proper sealing of the internal chamber 14 for processing when the chamber door 28 is closed. To further facilitate this sealing arrangement, a perimetric flange 34 is also preferably secured to the side wall 22 about the transfer slot 26 to provide an outer perimetric sealing surface 35 against which the seal 32 contacts in the closed position of the chamber door 28. One example of a suitable door closure mechanism 30 will be described below with reference to another embodiment of the present invention with the understanding that such mechanism could also be applied in this embodiment. Moreover, other closure mechanisms that include pneumatic, hydraulic, mechanical and electromechanical drive devices may instead by used. It is preferable, however, that the chamber door 28 be movable not only between positions opening and closing the transfer slot 26, but also movable toward and away from the side wall 22 to provide a good sealing arrangement. Such movements can be imparted by independent drive devices, or both such movements maybe controlled by a single drive device or a combination of several drive devices.

In accordance with one aspect of the present invention, the side wall 22 is preferably a part of a double-wall structure (i.e. having two or more spaced walls). In accordance with the embodiment illustrated in FIG. 2, for example, the side wall 22 includes a radially extending annular top portion 36, a radially extending annular middle portion 38, and a radially extending annular bottom portion 40. An outer wall 42 is further provided and connected to the annular top, middle and bottom portions 36, 38 and 40, respectively, to define the double-wall structure. The outer wall 42 may comprise an upper wall portion 44 and a lower wall portion 46 that may be fabricated independently from one another or together. In this regard, the middle annular portion 38 may extend all the way around the side wall 22, or may extend as a plurality of arc portions around the side wall 22 or even as discrete posts arranged about the side wall 22. More middle portions may be provided, or they may be arranged in any pattern on the side wall 22. Alternatively, the middle annular portion 38 may be eliminated, but it is preferred to provide mechanical structural strength to the double wall structure.

In any case, the double wall structure defines an internal wall cavity, that, as illustrated, is divided into an upper wall cavity 48 and a lower wall cavity 50. The upper wall cavity 48 does not extend completely around the internal chamber 14 as the perimetric flange 34 defining the transfer slot 26 passes through it at one portion of the side wall 22. The lower wall cavity 50 preferably extends completely about the internal chamber 14. The outer wall 42 is preferably connected with the inner wall 22, and the perimetric flange 34 is preferably connected with the side wall 22 by welding. Because of the temperatures experienced during thermal processing of semiconductor wafers, for example, it is desirable that the thermal processing chamber 10 comprise metal materials, such as aluminum. Other materials are also contemplated, such as stainless steel, and any other material suitable for the temperature profile of the chamber 10. It is further preferable that each of the components to be welded to one another be of similar metals to facilitate such welding. The result is a thermally and mechanically robust structure defining the thermal processing chamber 10. Of course, for other applications, other materials may be suitable and other connection techniques may be utilized. For example, at lower temperatures, plastics may be usable and adhesives may connect the components.

The chamber's bottom wall 20 is preferably fabricated intregally with the side wall 22. However, it may otherwise be formed separately and structurally secured to the side wall 22 by any conventional means. In this embodiment, the bottom wall 20 comprises a single wall including an opening 52, preferably centrally located, to facilitate the passage of components to and from the platen 18 as will be described below. Supported about the opening 52 on the chamber side of bottom wall 20 is a pedestal base 54. Preferably, the pedestal base 54 sits within an annular recess 56 formed within the bottom wall 20 from the internal chamber side so that conventional bolts 58 can secure the pedestal base 54 to the bottom wall 20. To effectively seal the internal chamber 14, a seal ring 60 is provided between a lower surface 62 of the pedestal base 54 and the bottom of the annular recess 56 so that as the pedestal base 54 is mounted via the bolts 58, a good sealing relationship is established. To facilitate this construction and to accommodate heat transfer abilities of this portion, the central portion 64 of the bottom wall 20 is preferably made thicker.

Also in the thicker central portion 64 of bottom wall 20, an exhaust passage 66 is preferably defined for removal of process fluids from within the internal chamber 14 as appropriate depending on the particular application. In particular, the exhaust channel 66 is preferably annular as provided by an annual recess 68 of the central portion 64 that is open to the internal chamber side thereof. One or more passages (not shown) are also provided extending through the remainder of the thickness of the central portion 64 so that exhaust fluids can be drawn from the exhaust channel 66 outside of the internal chamber 14 by conventional tubing and fittings or the like. To close the chamber side of the exhaust channel 66, a removable exhaust plate 70 is provided having an arrangement of orifices 74 provided in any desired pattern along the exhaust plate 70. Thus, by fluidly connecting the exhaust channel 66 to an exhaust system, fluid can be drawn from the internal chamber 14 through the orifices 72 into the exhaust channel 66 and out of the thermal processing chamber 10. By using a removable exhaust plate 70, the size of the orifices 72 can easily be varied depending on any particular application of the thermal processing chamber 10 by merely replacing the exhaust plate 70 with another of appropriate size orifices 72. The exhaust plate 70 is preferably fitted within a stepped portion of the annular recess 68 and is preferably secured in place by a plurality of fasteners 76 having head portions that overlap at least a portion of the exhaust plate 70 when secured in position. Preferably, the fasteners 76 are threaded within holes of the central portion 64 at appropriate locations to do so.

Also provided within the central portion 64 of the bottom wall 20, is a cooling channel 78. The cooling channel 78 also preferably comprises a recess made into the central portion 64 of bottom wall 20, but the recess is open to the outside of the bottom wall 20. The cooling channel 78 preferably substantially forms a circular channel (as viewed in a plan view) that is concentric with the opening 52. That is, the cooling channel 78 preferably stops short of defining a full circle so that one end of the cooling channel 78 can be utilized as an inlet and its other end can be used as an outlet. To close the cooling channel 78 from the outside, a plate 80 is secured to the central portion 64 of the bottom wall 20 so as to sealingly cover the cooling channel 78 and to provide inlet and outlet passages (not shown) by which the cooling channel 78 can be appropriately fluidly connected with input and outlet lines of a cooling system in any conventional way. (Note that the figures need to show the plate 80).

Also provided through the central portion 64 of the bottom wall 20 are a number of (preferably three) passages 82 (only one shown in FIG. 2) that accommodate reciprocal movement of lift pins 84. In addition to facilitating the reciprocal movement of the lift pins 84, the passages 82 must permit this movement while effectively sealing the internal chamber 14. To do this, seal rings 86 are preferably installed within a recess provided from the outside of the central portion 65 around the passages 82 for providing sealing sliding engagement with the lift pins 84. Such seal rings 86 may be secured in place by mounting plates retained, in turn, by a plurality of fasteners or any other conventional means.

The passages 82, and thus the lift pins 84, are preferably arranged concentrically (but need not be) about the opening 52 so as to extend within passages 88 (only one shown in FIG. 2) provided entirely through the thickness of platen 18. The platen 18, which is directly supported by the pedestal base 54 provides a support surface 90 onto which a wafer-like object 16 can be positioned in thermal transfer contact. The lift pins 84 are movable from a position where their tips 85 lie below the support surface 90 so as not to interfere with this thermal transfer contact. Lift pins 84 are movable as driven by a reciprocal drive mechanism 92 so as to be movable to positions where their tips 85 are located above the support service 90 so as to move the wafer-like object 16 to a non-thermal transfer contact position. That is, movement of the lift pins 84 move the wafer-like object 16 from its thermal transfer contact. This position is designated as the cooling state of the thermal processing chamber 10 as explained further below. The degree of lift pin 84 movement is dependent on the cooling needs and fluid flow characteristics of the internal chamber 14. In any case, it is considered that the object 16 be out of thermal transfer contact with platen 18 when it is moved to a cooling position.

To accomplish movement of lift pins 84 simultaneously, each lift pin 84 is preferably connected to a common element, such as a plate (not shown) so that a drive mechanism 92 can move the single element or plate and thus each lift pin 84 together. The drive mechanism 92 can comprise any known or developed mechanism capable of linear movement, such as a lead screw mechanism driven by a stepper motor. It is further preferable that each lift pin 84 further include an internal passage 94 that can be conventionally connected with a vacuum line or system so as to draw vacuum at openings through tips 85 for holding the wafer-like object 16 against the tips 85.

As will be further described below, the platen 18 includes other components that provide heat generation and temperature feedback control. In this regard, the opening 52 through the bottom wall 20 facilitates passage of a wiring conduit 94 and portions of any number of temperature sensing devices 96 that may be embedded within the platen 18. Temperature sensing devices may include conventional RTD sensors or thermocouple devices. Such temperature sensing devices can be used to provide temperature information of the platen 18 at various locations and depths within platen 18 and are connected with a control circuit so as to control the generation of heat by a heating mechanism within platen 18 in a conventional manner. The control mechanism itself does not form a particular part of the subject application and can be provided in any known or developed manner consistent with the basic operation of controlling the heat generated based upon temperature sensing information.

Closing off the top of the internal chamber 14 is the lid 24. Lid 24 preferably comprises a top wall 98 and a cover plate 100. The top wall 98, in the case of a cylindrical thermal processing chamber 10, also includes axially extending circular outer portion 102, circular middle portion 104 and circular inner portion 106. The result is an annular outer chamber 108, an annular middle chamber 110 and a circular inner chamber 112. Each of these chambers are closed off by the cover plate 100 which is conventionally secured to the top wall 98 by conventional fasteners 114, such as bolts. The lid 24, comprising both the top wall 98 and cover plate 100, is connected to the top of the side wall 22 also by a plurality of conventional fasteners 116 such as bolts. A further seal 118 is also preferably provided within a recess of a top surface of the side wall 22 so as to provide an effective seal of the internal chamber 14 when the lower edge surface of top wall 98 is secured in place by the fasteners 116. By way of the seal 118, seal ring 60, door seal 32 and lift pin seals 86, the internal chamber 14 is effectively provided for thermal processing therein.

For reasons discussed in the operation of the thermal processing chamber 10 below, the outer chamber 108 can fluidly communicate with the internal chamber 14 by way of a series of orifices 120. Likewise, the inner chamber 112 can fluidly communicate with the internal chamber 14 by orifices 122. It is also desirable to provide fluid communication between the outer chamber 108 and inner chamber 112 with supply lines provided outside of the thermal processing chamber 10. To do this, conventional fluid lines and fittings can be conventionally utilized to connect with fluid sources and supply fluid through passages (not shown) through the cover plate 100 at appropriate locations for fluid to enter the outer and inner chambers 108 and 112, respectively.

Figure 5:
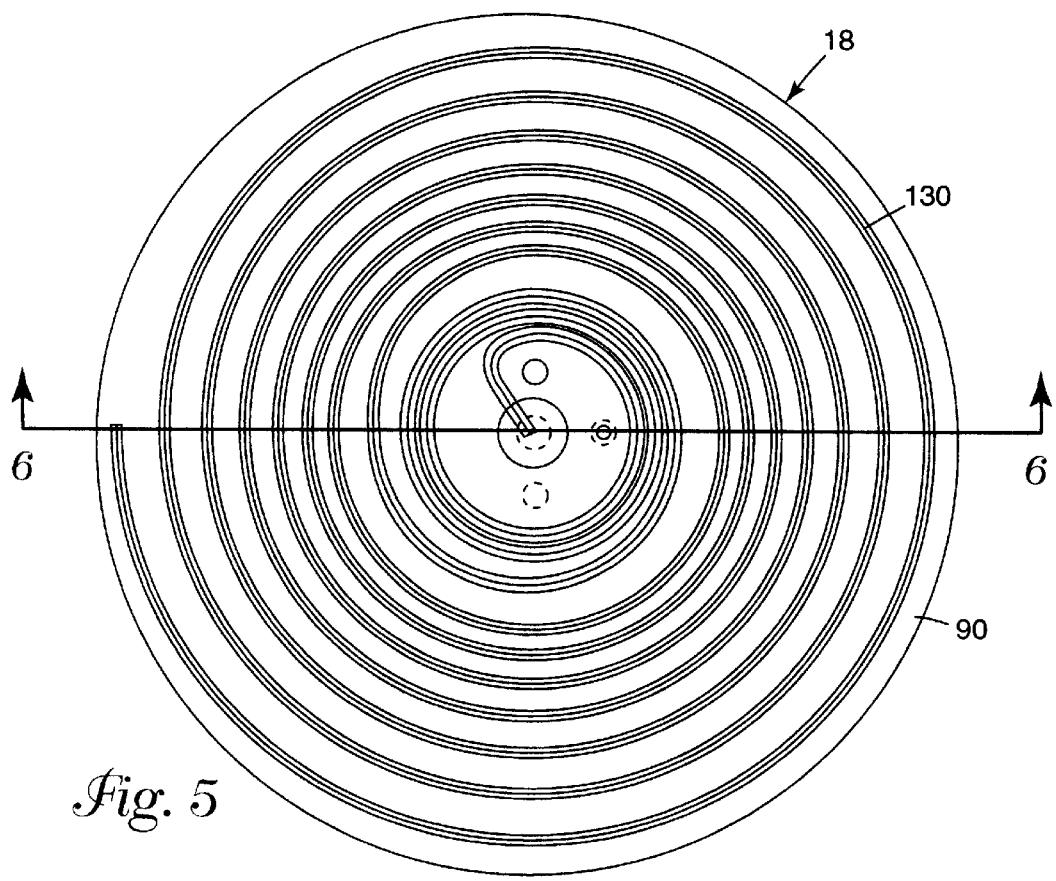
FIG. 5 is a top plan view of a pedestal heater showing one possible configuration for a heater layout.
Figure 6:
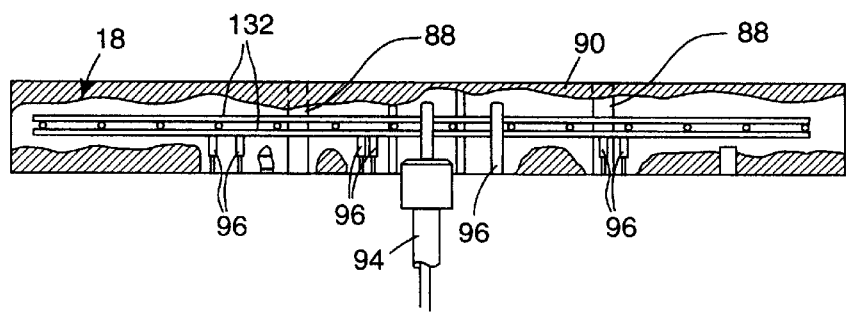
FIG. 6 is a cross sectional view through the pedestal heater illustrated in FIG. 5.

As noted above, the platen 18 itself preferably comprises a heater mechanism for providing heat transfer to a wafer-like object 16 when supported on the surface 90 thereof. Preferably, the heating mechanism will supply heat to allow effective heat transfer to the entire wafer-like object 16. As shown in FIGS. 5 and 6, one specific example of a heater mechanism is illustrated which comprises a heater cable 130 that is cast within the platen 18 to provide a pedestal heater. The cable heater 130 is illustrated in FIG. 5 as having a spiral pattern so that heat can be generated and distributed over the entire surface 90 of the platen 18. That way, effective heat transfer can be provided to a wafer-like object 16 when supported in a heat transfer contact position. The spiral pattern may be modified depending on the desired application and heat transfer requirements, and many different patterns can be developed. Moreover, multiple zones may be created for affecting the wafer-like object 16 differently at different portions thereof. In this regard, more than one heating element may be utilized. As illustrated in FIG. 6, a framework 132 may be utilized within the body of the platen 18 for accurately controlling the positioning of such a heater cable 130 so as to define its pattern during the casting process of the pedestal heater. Such framework 132 may comprise any number of components and features for the purpose of precisely defining the desired pattern including one or more heating elements.

Alternative heater devices can comprise any known or developed film heater, such as the type including a film layer or mica layer having a heater circuit printed on a surface thereof. Such a film heater could be connected on the top surface of the platen, in which case the heater would provide the wafer-like object support surface instead of the top surface of the platen itself. As yet another alternative, a heater circuit may be printed directly onto the top or bottom surface of a platen. Or as yet another alternative, the heating device disclosed in copending U.S. patent application Ser. No. 09/035,628, filed Mar. 5, 1998, and owned by the assignee of the subject application, could also be utilized. In any case, appropriate passages can be provided through the platen to provide the electrical connections and any other electrical or mechanical needs. Moreover, any number of temperature sensors 96 can be provided throughout and at various levels within the platen 18 for monitoring and providing feedback information to a control circuit for driving the heater mechanism.

The thermal processing chamber 10 described above is designed in particular for enhanced performance as a thermal processing chamber that facilitates both heating and cooling of a wafer-like object 16 within the internal chamber 14. Moreover, the thermal processing chamber 10 is designed to enhance thermal uniformity of the chamber so that heat is transferred to a wafer-like object 16 from a heater within or upon the platen 18 in a precisely uniform manner. In the production of many products, such as semiconductor wafers with dielectric material (described above in the Background section), it is important that the entire object be uniformly heated so that exact processing of the entire object surface is thermally treated. For example, in the case of processing a semiconductor wafer with a high temperature curing material, the dielectric material is cured by raising the entire wafer surface to a temperature of 200° or more for a specific length of time. As also discussed above in the Background section of this application, it has been discovered that the design of the chamber 10 and its components affect such thermal uniformity. That is, the design of the side walls, bottom wall, lid, pedestal and platen all contribute to such thermal uniformity in either a positive or negative way. Moreover, the fact that the chamber 10 is to be utilized as both a heating and cooling chamber exacerbates this problem. That is, the effect of cooling the chamber between heating operations affects the temperature of the components of and within the thermal processing chamber so as to affect its next use in a heating operation and thus its thermal uniformity in that next operation.

In accordance with the present invention, the design of the thermal processing chamber 10 and method of using it in processing a wafer-like object 16 include a number of features and steps that have been developed for the purpose of enhancing the thermal uniformity of the heating step, even at high temperature processing.

One such feature is the provision of the double side wall structure. In particular, this design provides a good heat conductive inside surface by way of the inner surface of side wall 22 and provides an outer wall 42 that is thermally insulated from the side wall 22 thus, the interior surface of the side wall 22 is insulated from the effects of temperatures outside of the chamber, and the external surface 42 is likewise insulated from the side wall 22. The particular advantage of this construction is that the inside surface of side wall 22 can be heated and remain heated without substantial cooling between cycles of operation. Good heat conductivity along all internal surfaces is advantageous, and it is desirable to keep the internal surfaces as hot as possible (up to the process temperature) to enhance thermal uniformity.

Another specific feature provided for this purpose is the inner and outer chambers 108 and 112, respectively, formed within the lid 24. Not only do these chambers, along with the middle chamber 110, provide an insulating effect in a similar manner to the double side wall construction, the chambers can be utilized for circulating gases throughout the internal chamber 14. Advantageously, the inner chamber 112 can be utilized to supply cooling gas for cooling the wafer-like object 16 after the heating step is conducted and while the wafer-like object 16 is moved to a cooling state by extension of lift pins 84 by taking the wafer-like object 16 out of thermal transfer contact with the platen 18. With the wafer-like object 16 supported out of thermal transfer contact, cooling gas can be circulated from inner chamber 112 through orifices 122 about the wafer-like object 16 within the internal chamber 14 and exhausted through the exhaust channel 66. Circulation of the cooling gas would have little effect on the temperature of the interior surface of the side wall 22 as its flow would be primarily directed across the wafer-like object 16, around the platen 18 and into the exhaust channel 66.

Another feature provided to enhance the uniformity is the gas cooling channel 78 defined within the central portion 64 of the bottom wall 20. The gas cooling channel 78, however, is not for the purpose of maintaining heat, but is instead to provide a cooling function of the central portion 64 of bottom wall 20. Because heat is generated by the platen 18, heat is conducted through the pedestal base 54 to the central portion 64. The cooling of the central portion 64 permits the remainder of the bottom wall 20 and the side wall 22 to be maintained at a sufficiently high heat level but not to permit the central portion 64 to become overheated. An overheated condition could result in the destruction of the seals 60 and 86 which are necessary to maintain the internal chamber 14. Thus, the gas cooling channel 78 balances the heat extending across the bottom wall 20 to further assist in the thermal uniformity of the thermal processing chamber 10. Of course, other configurations for the gas cooling channel 78 may be designed based upon the particular cooling requirements of a particular application and the degree of heat conducted to the bottom wall 20. The use of cooling gas provides a significant advantage over liquid cooling techniques in that liquid would impinge on the interior surface of the cooling channel 78 and cause it to cool to a greater degree. Moreover, such a liquid could be caused to boil by the high temperature of the bottom wall 20 which itself could have many adverse effects within a cooling liquid supply system.

These features and others noted below contribute to the achievement of a thermal processing chamber within which efficient and effective heating and cooling of a wafer-like object can take place. In one aspect, this is done by carefully controlling the flow of heat (radiatively, convectively and conductively) as well as the composition of the gases in the processing environment. Radiative heat transfer control is achieved by maintaining the surfaces "visible" to the wafer-like object as close to the processing temperature as possible. Convective heat transfer control is achieved by establishing the proper gas flow pattern on the exposed surface of the wafer-like object. This flow pattern may be called upon to correct for other nonuniformities in the process. Conductive heat transfer control is achieved by ensuring uniform contact between the wafer-like object and the heating surface and by ensuring that the contacting surface temperature is as uniform as possible. Control of the gas composition in the processing environment is achieved by isolating the processing environment from the ambient environment and by maximizing the flexibility and control of gas flow in the processing environment.

In accordance with the present invention, the surfaces visible to the wafer-like object are preferably maintained close to the processing temperature through the use of three essential features. First, the chamber wall incorporates a double walled design that allows superior thermal isolation of the inner surface of chamber wall 22 from the much cooler outer surface of outer wall 42. Second, the cooling required to maintain chamber seals, such as seals 60 and 86, within their thermal operating ranges is accomplished by the use of an internal gas cooling channel 78 rather than a liquid cooling channel. Due to their generally lower heat capacity than liquids, gases allow more precise and reliable temperature control by permitting finer control of the heat transfer rate. The thermal limit of liquids also constrains their boiling point, which can create safety as well as reliability hazards. The thermal limit of gases allows the chamber wall to operate at higher temperatures, reducing heat transfer from the wafer-like object and, therefore, improving temperature uniformity. Third, careful control of the heat transfer from the pedestal heater, comprising the platen 18 and its heating element, to the chamber bottom wall 20 and side walls 22 prevent temperature gradients along the walls, improving the uniformity of the visible surfaces. This control may be achieved by reducing the cross sectional area of conductive paths or by increasing their lengths. Control may also be achieved by minimizing emissivity of the heater surface thereby minimizing the radiation between the heater and the chamber wall.

The present invention promotes the development of the proper convective gas flow through the use of three elements. First, the use of separately variable inner and outer gas introduction patterns above the wafer-like object (see FIG. 3) allow the ratio and magnitude of the flows to be adjusted to achieve the optimum flow pattern on the wafer-like object. This can be done by appropriate sizing of the respective orifices 120 and 122 and/or by otherwise controlling gas supply (i.e. by pressure). Second, the use of a chamber door 28 minimizes gas disturbances during transfer of the wafer-like object 16, minimizing the time required to establish the required gas flow. Third, the use of removable exhaust plate 72 simplifies the investigation of widely varying exhaust patterns, promoting the achievement of the optimum gas flow environment.

The separate inner and outer gas introduction patterns allow sophisticated purging routines to be developed that can create the proper gas composition in the minimum amount of time. The removable exhaust plate 72 assists in establishing the optimum gas flow pattern.

To ensure superior conductive heat transfer control, the present invention preferably employs a pedestal-style heater that contacts the cooler chamber bottom wall 20 at a single, preferably central point. This point of contact may then be carefully minimized to reduce losses to the chamber, improving pedestal surface uniformity. Heater surface uniformity is also improved by maximizing the radiative emissivity between the wafer-like object and the contacting heater surface while minimizing the radiative emissivity between the other heater surfaces and the chamber wall. The radiative emissivity of the heater surfaces may be controlled by chemical (e.g. anodization) or mechanical (e.g. ball peening) treatment. In particular, the surface or surfaces visible to the wafer-like object may be anodized while the other surfaces are left with a finely machined finish. To ensure good contact between the wafer-like object and the heater surface, channels on the pedestal surface are evacuated, the resulting pressure difference across the wafer-like object driving it against the heater surface.

The operation of a complete cycle and method of using the thermal processing chamber 10 in accordance with the present invention is described as follows with reference to FIGS. 2, 3 and 4. Starting with a transfer state of the thermal processing chamber 10 illustrated in FIG. 4, with the chamber door 28 in its open position, a wafer-like object 16 is positioned onto the tips of pins 84 (as they are extended in the transfer position) by way of a conventional robotic handling device that is capable of grasping and moving such a wafer-like object 16 and loading it onto the pins 84. Such robotic handlers are well-known, including those of the type that move a wafer within the x and y plane, as well as those which move a wafer in x, y and z directions to facilitate wafer loading the removal. The purge gas is activated at this time to minimize entry of atmospheric gases into the processing chamber. Preferably, gas is circulated through the internal chamber 14 and out through the exhaust channel 66 as supplied through both the inner chamber 112 and the outer chamber 108. Only one or the other of the inner and outer chambers 112 and 108, respectively, may be used for this if desired, or, the middle chamber 110 may be used instead or in combination with one or both, provided that a proper supply and orifices are included.

Suitable purge gases are preferably those that do not adversely affect the particular process of a particular application. For many applications, inert gases are preferred.

After a wafer-like object 16 is transferred onto the pins 84, as shown in FIG. 4, the pins 84 are lowered to configure the thermal processing chamber 10 in a heating state, as illustrated in FIG. 2. The heating state is defined by the wafer-like object 16 being in thermal transfer contact with the surface 90 of the platen 18, with lift pins 84 retracted and the chamber door 28 in a closed sealed position. In this state, the wafer-like object 16 can be thermally processed by heat generated from platen 18 and transferred to the wafer-like object 16. For the many reasons discussed above, thermal uniformity of the heating process is achieved in accordance with the present invention. During this heating step, purge gas may be provided through one of or both of the inner and outer chambers 112 and 108 within lid 24 for circulation within the internal chamber 14 and exhausted through exhaust channel 66.

Once the heating operation is fully conducted, and while the chamber door 28 remains closed, the wafer-like object 16 can be elevated to a position where it is no longer in thermal transfer contact with the platen 18. This is accomplished by extending the lift pins 82 so that the tips thereof extend a sufficient distance beyond the support surface of platen 18. The wafer-like object may then be cooled by the flow of gases from one of or both of the inner and outer chambers 112 and 108 within lid 24. When cooling has been accomplished, the door 28 may then be opened to permit removal by the object transfer mechanism.

Figure 7:
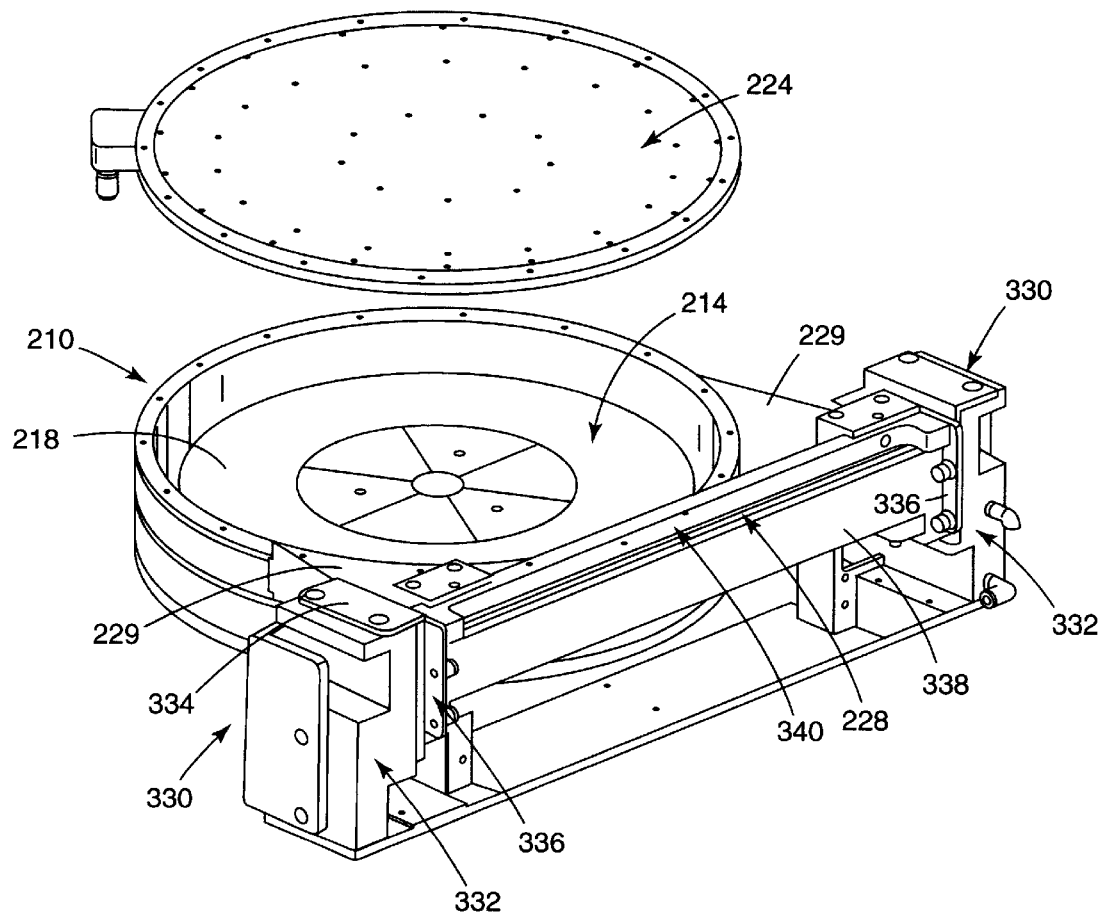
FIG. 7 is a perspective view of an alternative apparatus including another thermal processing chamber also in accordance with the present invention.
Figure 8:
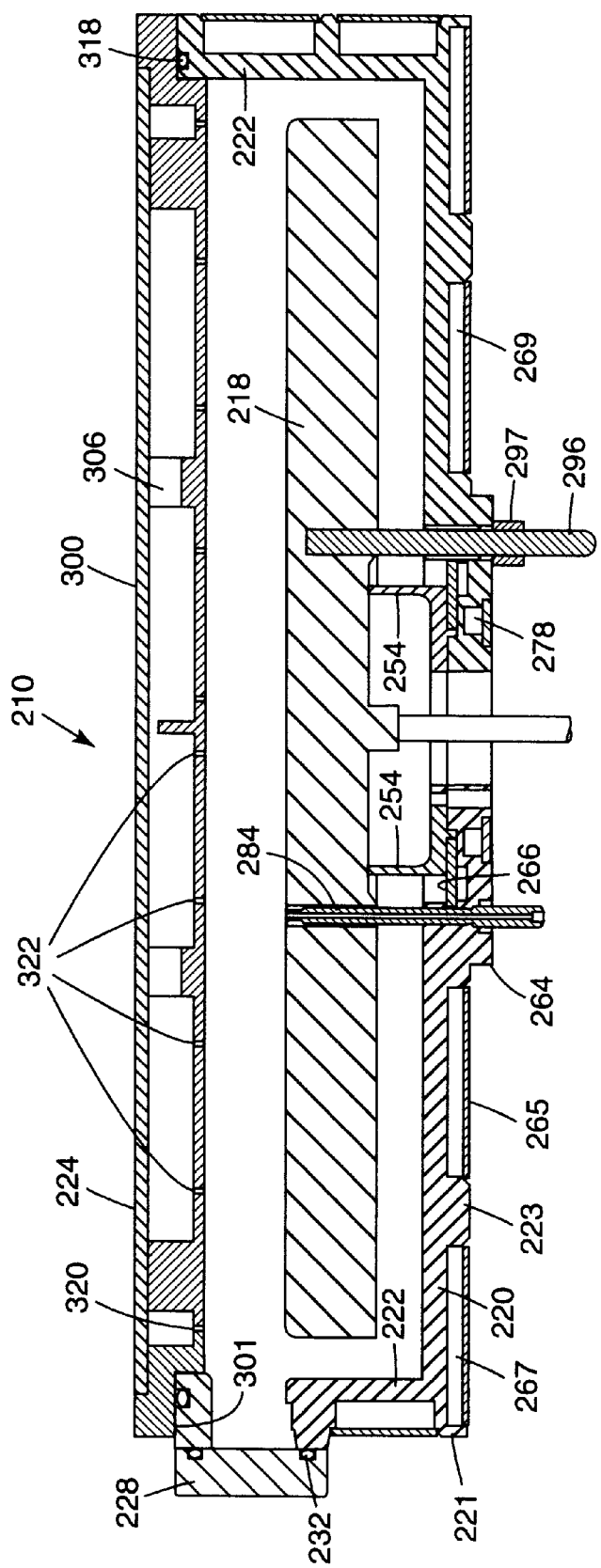
FIG. 8 is a cross sectional view taken through the thermal processing chamber of FIG. 7.

With reference to FIGS. 7 and 8, another embodiment of a thermal processing chamber 200 is described as follows. To the extent that the components and construction of thermal processing chamber 200 are similar to those of the thermal processing chamber 10, their description and functionality will not be described in detail again, and the following description is directed to the differences between them. It is further understood that any of such differences may be incorporated within the thermal processing chamber 10 independently or in any combination with one another.

In the thermal processing chamber 200, a bottom wall 220 further includes an axially extending annular outer portion 221 and an axially extending annular middle portion 223 that together with stepped edge of the central portion 264 provide mounting surfaces for a spaced outer bottom wall 265. Like the outer side wall 42, the outer bottom wall 265 provides part of a double bottom wall structure with an increase in thermal isolation due to the insulating capability of the structure and an increase in structural strength. The outer bottom wall 265 may be welded or otherwise connected with the bottom wall 220 in the same manner as the side wall construction, and the portions 221 and 223 may also be modified as suggested above with regard to the side wall. As illustrated, an annular outer bottom chamber 267 and an annular inner bottom chamber 269 are thereby defined.

The bottom wall 220 is also modified in that the exhaust channel 266 is moved inboard of the lift pins 284 and the cooling channel 278 is moved further inboard to be positioned under the pedestal base 254. The removable exhaust plate 270 is positioned to cover the exhaust channel 278 and to partially extend between the lower surface of the pedestal base 254 and the surface of a stepped down portion of the central portion 264 of the bottom wall 220 adjacent to the provision of the seal ring 260. By moving the exhaust channel 278 closer to the pedestal base 254, the circulation of fluid within the internal chamber 214 is improved and the purge efficiency of the internal chamber 214 is improved by reducing circulation of the gas in the region between the exhaust channel 266 and the pedestal base 254. Another advantage of this design is that the seal ring 260 is spaced further in a heat transfer path from the platen 218 without spacing the platen 218 further from the bottom wall 220, and the added distance further protects the seal ring 260 from thermal breakdown. By also positioning the seal ring 260 closer in a heat transfer path to the cooling channel 278, it is further protected. As also shown in FIG. 8, a temperature sensor 296 may instead be extended through the bottom wall 220, and in particular through its central portion 264. As this provides another opening through the bottom wall 220 into the internal chamber 214, a sealing ring 297 of any conventional construction is also provided between the temperature sensor 296 and the central portion 264.

Another difference of the thermal processing chamber 200 is in the construction of the lid 224. A double wall structure is provided in a similar sense as that of lid 24, but axially extending middle annular portion 306 is provided with one or more lower sections that do not extend to contact the cover plate 300 so as to provide fluidic communication between the middle and inner lid chambers 310 and 312, respectively. That is, the middle and inner chambers 310 and 312 act as a single chamber through which cooling gas can be dispensed into the internal chamber 214. As such, many more orifices 322 can be provided and at different location for a different distribution of cooling gas into the internal chamber 214. The ability to change the distribution pattern is thus enhanced, and gas flow uniformity against a wafer-like object 216 may be improved for in situ wafer cooling.

Yet another difference of the thermal processing chamber 200 is in the connection of the lid 224 to the upper edge of the side wall 222. By providing an annular step 301 at the peripheral edge of the top wall 298, the internal surface of the top wall 298 is positioned closer to the wafer-like object 216 so as to reduce circulation and improve purging efficiency and to bring the orifices 322 closer to the wafer-like object 216 to improve cooling performance.

Also illustrated in FIG. 7 is a door closure mechanism usable in accordance with any thermal processing chamber of the present invention that provides vertical and horizontal movement of a chamber door. The illustrated chamber door 228 is substantially planar and is adapted to the thermal processing chamber 210 by a housing adapter 229. A door closure mechanism 330 includes a pair of door actuators 332, themselves each comprising a conventional drive device, such as a pneumatic cylinder (not shown) and a first slide component 334. A cooperating slide component 336 is connected with a door frame 338. The movable portion of the drive device (e.g. a piston of a cylinder) is connected with the slide component 336 to move the door frame 338 vertically as guided by the first slide component 334. The chamber door 328 is itself operatively connected to the door frame 338 by way of a known four-bar mechanism (not shown) that permits the chamber door 328 to move horizontally. To cause this horizontal movement, a door stop 340 is positioned above the upper edge of the chamber door 328, the door stop 340 having a first cam surface (not shown) that cooperates with the upper edge of the chamber door 328 (or a roller or other element positioned there). By this arrangement, upward movement of the chamber door 328 after an initial engagement of the door stop 340 and chamber door 328 in translated into horizontal movement of the chamber door 328. This horizontal movement is utilized in providing a suitable force for sealing the chamber door 328 to the chamber side wall 222 with seal 232 therebetween.

One specific apparatus including any thermal processing chamber disclosed or suggested in accordance with the present invention is illustrated in FIG. 9. Specifically, a cluster apparatus 400 is shown that includes a thermal processing chamber 402 among a number of other processing stations 404, 406, 408 and 410. For the processing of semiconductor wafers, for example, other stations may be coating, dispensing, curing or wafer storing stations. A wafer transfer mechanism 412 may also be provided. Such other stations and transfer mechanisms are well known and can be varied depending of the particular application. One such cluster apparatus to which the present invention is particularly applicable for the processing of semiconductor wafers is a cluster apparatus that is commercially available from the FSI International, Inc., the assignee of the present invention, under the trade designation "Calypso", wherein the thermal processing chamber of the present invention can be incorporated as one of its stations for semiconductor wafer processing. As noted above, it is also contemplated that any apparatus having a thermal processing chamber in accordance with the present invention may also be provided in the form of a stand-alone apparatus, in which case the thermal processing chamber could be used alone or in combination with any other apparatus.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the scope and spirit of the present invention which is indicated by the following claims.

What is claimed is:

1. An apparatus for thermally processing wafer-like objects comprising:

a thermal processing chamber having a walled structure comprising a bottom and at least one side wall within which an internal chamber is defined and a transfer opening through which a wafer-like object can be inserted within the internal chamber or removed from the thermal processing chamber and which is closeable to also define the internal chamber, the walled structure including at least an insulating portion thereof comprising an inner wall portion that defines part of the internal chamber that is fixedly spaced from an outer wall portion;

a platen operatively positioned within the thermal processing chamber and including a heat generation device and having a support surface for supporting a wafer-like object in heat transfer contact;

a gas inlet permitting gas flow into the internal chamber; and a gas outlet open within the internal chamber through which gas can be exhausted from the internal chamber, the gas outlet having a location that is spaced from a location of the gas inlet with respect to the platen so that gas will flow at least partially about the platen when gas is exhausted from the internal chamber.

2. The apparatus of claim 1, wherein the thermal processing chamber comprises a bottom wall and at least one side wall portion that are comprised of heat conductive material, and the insulating portion of the walled structure is provided within the side wall.

3. The apparatus of claim 2, wherein the thermal processing chamber further comprises a lid, and the lid also includes a portion having inner and outer spaced wall portions.

4. The apparatus of claim 3, wherein the lid comprises at least one supply chamber formed by its inner and outer spaced wall portions, and at least one gas inlet open from the supply chamber into the internal chamber of the thermal processing chamber.

5. The apparatus of claim 4, wherein the lid comprises a plurality of supply chambers that are fluidly isolated from one another, each supply chamber being formed by inner and outer spaced wall portions of the lid, and each having at least one gas inlet that opens into the internal chamber of the thermal processing chamber.

6. The apparatus of claim 2, wherein the platen is operatively supported by the bottom of the thermal processing chamber by way of a pedestal base, and the bottom includes a cooling channel extending over at least a portion of the bottom and connectable with a source of cooling fluid for controlling the temperature of the portion of the bottom.

7. The apparatus of claim 6, wherein the cooling channel substantially surrounds the pedestal base.

8. The apparatus of claim 2, wherein the bottom of the thermal processing chamber further includes an exhaust channel extending along at least a portion of the bottom and which is open to the internal chamber by at least one gas outlet.

9. The apparatus of claim 8, wherein the gas outlet is provided through an exhaust plate that is removably connected with the thermal processing chamber so that exhaust flow can be modified by changing the exhaust plate with a different gas outlet fluid flow capacity.

10. The apparatus of claim 9, wherein the platen is operatively supported by the bottom of the thermal processing chamber by way of a pedestal base, and the bottom includes a cooling channel extending over at least a portion of the bottom and connectable with a source of cooling fluid for controlling the temperature of the portion of the bottom, and the exhaust plate separates at least a portion of the exhaust plate from the cooling channel.

11. The apparatus of claim 10, wherein the bottom includes a relatively thicker central region and a peripheral thinner region, and the exhaust channel and the cooling channel extend within the thicker central region.

12. The apparatus of claim 11, further including an outside bottom wall that is spaced from the peripheral thinner region of the bottom, which is connected thereto so as to provide another insulating portion of the thermal processing chamber.

13. The apparatus of claim 2, farther including a movable element that is operatively movably supported relative to the support surface of the platen for engaging a wafer-like object when supported within the thermal processing chamber and for moving the wafer-like object from heat transfer contact with the platen to a spaced cooling position.

14. An apparatus for thermally processing wafer-like objects comprising:
   a thermal processing chamber having a walled structure comprising a bottom and at least one side wall within which an internal chamber is defined and a transfer opening through the side wall so that a wafer-like object can be inserted within the internal chamber or removed from the thermal processing chamber and which is closeable to also define the internal chamber;
   a platen operatively positioned within the thermal processing chamber and including a heat generation device and having a support surface for supporting a wafer-like object in heat transfer contact;
   a gas inlet permitting gas flow into the internal chamber; and
   a gas outlet open within the internal chamber through which gas can be exhausted from the internal chamber, the gas outlet having a location that is spaced from a location of the gas inlet with respect to the platen so that gas will flow at least partially about the platen when gas is exhausted from the internal chamber,
   wherein the platen is operatively supported by the bottom of the thermal processing chamber by way of a pedestal base to conduct heat from the platen to the bottom, and the bottom includes a cooling channel extending over at least a portion of the bottom and connectable with a source of cooling fluid for controlling the temperature of the portion of the bottom.

15. The apparatus of claim 14, wherein the cooling channel substantially surrounds the pedestal base.

16. The apparatus of claim 15, wherein the bottom of the thermal processing chamber further includes an exhaust channel extending along at least a portion of the bottom and which is open to the internal chamber by at least one gas outlet.

17. The apparatus of claim 16, wherein the gas outlet is provided through an exhaust plate that is removably connected with the thermal processing chamber so that exhaust flow can be modified by changing the exhaust plate with a different gas outlet fluid flow capacity.

18. The apparatus of claim 17, wherein the bottom includes a relatively thicker central region and a peripheral thinner region, and the exhaust channel and the cooling channel extend within the thicker central region.

19. The apparatus of claim 14, wherein the side wall structure of the thermal processing chamber includes at least an insulating portion thereof comprising spaced inner and outer wall portions.

20. An apparatus for thermally processing wafer-like objects comprising:
   a thermal processing chamber having a walled structure comprising a bottom, at least one side wall and a lid within which an internal chamber is defined and a transfer opening through the side wall so that a wafer-like object can be inserted within the internal chamber or removed from the thermal processing chamber and which is closeable to also define the internal chamber;
   a platen operatively positioned within the thermal processing chamber and including a heat generation device and having a support surface for supporting a wafer-like object in heat transfer contact;
   a gas inlet permitting gas flow into the internal chamber; and
   a gas outlet open within the internal chamber through which gas can be exhausted from the internal chamber, the gas outlet having a location that is spaced from a location of the gas inlet with respect to the platen so that gas will flow at least partially about the platen when gas is exhausted from the internal chamber,
   wherein the lid of the thermal processing chamber includes a portion thereof having inner and outer spaced wall portions that provide a plurality of fluidly isolated supply chambers that are each formed by the inner and outer spaced wall portions, and a gas inlet is open from each of the supply chambers into the internal chamber of the thermal processing chamber.

21. The apparatus of claim 20, wherein the platen is operatively supported by the bottom of the thermal processing chamber by way of a pedestal base, and the bottom includes a cooling channel extending over at least a portion of the bottom and connectable with a source of cooling fluid for controlling the temperature of the portion of the bottom.

22. The apparatus of claim 21, wherein the side wall structure of the thermal processing chamber includes at least an insulating portion thereof comprising spaced inner and outer wall portions.

23. An apparatus for thermally processing wafer-like objects comprising:
- a thermal processing chamber having a walled structure comprising a bottom and at least one side wall within which an internal chamber is defined and a transfer opening through the side wall so that a wafer-like object can be inserted within the internal chamber or removed from the thermal processing chamber and which is closeable to also define the internal chamber;
- a platen operatively positioned within the thermal processing chamber and including a heat generation device and having a support surface for supporting a wafer-like object in heat transfer contact;
- a gas inlet permitting gas flow into the internal chamber; and
- a gas outlet open within the internal chamber through which gas can be exhausted from the internal chamber, the gas outlet having a location that is spaced from a location of the gas inlet with respect to the platen so that gas will flow at least partially about the platen when gas is exhausted from the internal chamber, wherein the bottom of the thermal processing chamber further includes an exhaust channel extending along at least a portion of the bottom for directing gas flow within the exhaust channel along the chamber bottom, the exhaust channel being open to the internal chamber by the gas outlet.

24. The apparatus of claim 23, wherein the gas outlet is provided through an exhaust plate that is removably connected with the thermal processing chamber so that exhaust flow can be modified by changing the exhaust plate with a different gas outlet fluid flow capacity.

25. The apparatus of claim 24, wherein the platen is operatively supported by the bottom of the thermal processing chamber by way of a pedestal base, and the bottom includes a cooling channel extending over at least a portion of the bottom and connectable with a source of cooling fluid for controlling the temperature of the portion of the bottom.

26. The apparatus of claim 25, wherein the exhaust plate separates at least a portion of the exhaust plate from the cooling channel.

27. The apparatus of claim 25, wherein the bottom includes a relatively thicker central region and a peripheral thinner region, and the exhaust channel and the cooling channel extend within the thicker central region.

28. The apparatus of claim 27, further including an outside bottom wall that is spaced from the peripheral thinner region of the bottom, which is connected thereto so as to provide another insulating portion of the thermal processing chamber.

29. The apparatus of claim 23, wherein the side wall structure of the thermal processing chamber includes at least an insulating portion thereof comprising spaced inner and outer wall portions.

* * * * *